(12) United States Patent
Kobayashi et al.

(10) Patent No.: US 10,622,446 B2
(45) Date of Patent: Apr. 14, 2020

(54) SILICON CARBIDE BASED POWER SEMICONDUCTOR DEVICE WITH LOW ON VOLTAGE AND HIGH SPEED CHARACTERISTICS

(71) Applicant: FUJI ELECTRIC CO., LTD., Kawasaki-shi, Kanagawa (JP)

(72) Inventors: Yusuke Kobayashi, Tsukuba (JP); Akimasa Kinoshita, Matsumoto (JP); Shinsuke Harada, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 206 days.

(21) Appl. No.: 15/665,981

(22) Filed: Aug. 1, 2017

(65) Prior Publication Data

US 2018/0040698 A1 Feb. 8, 2018

(30) Foreign Application Priority Data

Aug. 5, 2016 (JP) .................................. 2016-155095

(51) Int. Cl.
| | |
|---|---|
| *H01L 29/10* | (2006.01) |
| *H01L 29/66* | (2006.01) |
| *H01L 29/08* | (2006.01) |
| *H01L 29/78* | (2006.01) |
| *H01L 29/06* | (2006.01) |

(Continued)

(52) U.S. Cl.
CPC ...... *H01L 29/1041* (2013.01); *H01L 29/0878* (2013.01); *H01L 29/1095* (2013.01); *H01L 29/66068* (2013.01); *H01L 29/66734* (2013.01); *H01L 29/7813* (2013.01); *H01L 29/0623* (2013.01); *H01L 29/1608* (2013.01); *H01L 29/7397* (2013.01)

(58) Field of Classification Search
None
See application file for complete search history.

(56) References Cited

U.S. PATENT DOCUMENTS 9,093,522 B1 * 7/2015 Zeng .................... H01L 29/7813
2013/0105889 A1 * 5/2013 Fujiwara ........... H01L 29/66068
257/330

OTHER PUBLICATIONS https://www.merriam-webster.com/dictionary/beneath; 2017.*
(Continued)

*Primary Examiner* — Niluffa Rahim
(74) *Attorney, Agent, or Firm* — Rabin & Berdo, P.C.

(57) ABSTRACT

A semiconductor device includes in an active region in which current flows, an $n^+$-type silicon carbide epitaxial layer of a low concentration and formed on an $n^+$-type silicon carbide substrate; a p-type channel region constituting a channel region; a trench contacting the p-type channel region and having embedded therein an oxide film and a gate electrode; a $p^+$-type base layer arranged beneath the trench; a third n-type CSL layer region contacting the p-type channel region; a second n-type CSL layer region having a maximum impurity concentration higher than that of the third n-type CSL layer region, the maximum impurity concentration being farther on a substrate front side than a top of the $p^+$-type base layer arranged beneath the trench is; and a first n-type CSL layer region contacting the second n-type CSL layer region and having a maximum impurity concentration lower than that of the second n-type CSL layer region.

7 Claims, 10 Drawing Sheets

(51) Int. Cl.
*H01L 29/16* (2006.01)
*H01L 29/739* (2006.01)

(56) References Cited

OTHER PUBLICATIONS https://www.merriam-webster.com/dictionary/beneath; 2018.*
Tsunenobu Kimoto and James A. Cooper, "Fundamentals of Silicon Carbide Technology", IEEE Press, pp. 320-324, 2014.

* cited by examiner

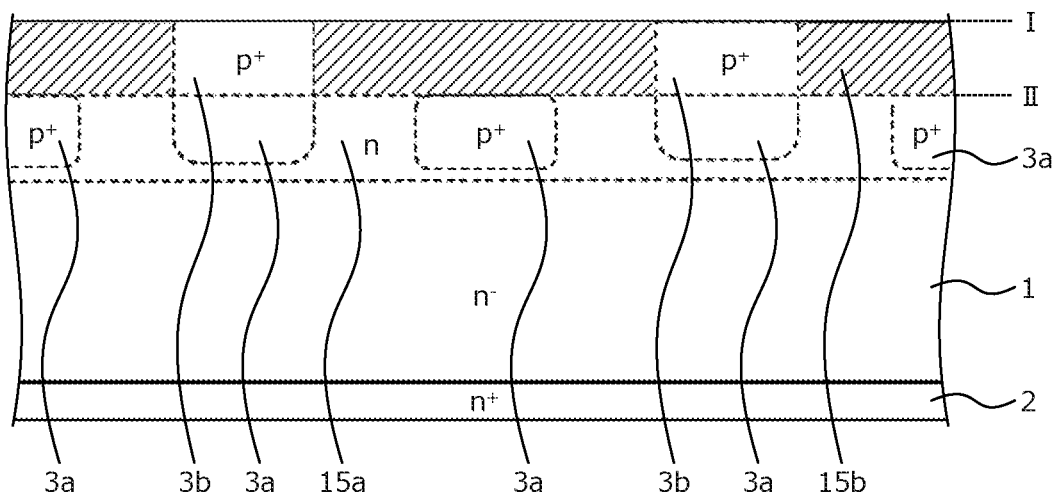
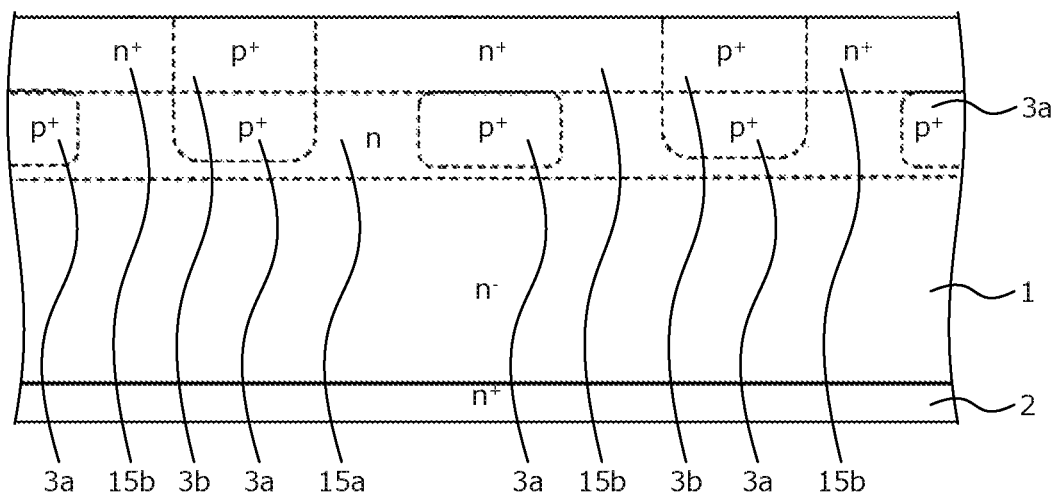

SILICON CARBIDE BASED POWER SEMICONDUCTOR DEVICE WITH LOW ON VOLTAGE AND HIGH SPEED CHARACTERISTICS

CROSS REFERENCE TO RELATED APPLICATIONS

This application is based upon and claims the benefit of priority of the prior Japanese Patent Application No. 2016-155095, filed on Aug. 5, 2016, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Conventionally, silicon (Si) is used as a constituent material of power semiconductor devices that control high voltage and/or large current. There are several types of power semiconductor devices such as bipolar transistors, insulated-gate bipolar transistors (IGBTs), and MOSFETs. These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to be adapted for large current but can be switched at high speeds up to about several MHz.

Nonetheless, there has been a strong demand in the market for a power semiconductor device achieving both large current and high speed. Thus, IGBTs and power MOSFETs have been intensively developed and improved, and the performance of power devices has substantially reached the theoretical limit determined by the material. In terms of power semiconductor devices, semiconductor materials replacing silicon have been investigated and silicon carbide (SiC) has been focused on as a semiconductor material enabling production (manufacture) of a next-generation power semiconductor device with a low ON voltage, high-speed characteristics, and high-temperature characteristics.

Silicon carbide is chemically a very stable semiconductor material, has a wide bandgap of 3 eV, and can be used very stably as a semiconductor even at high temperatures. Silicon carbide has a critical electric field strength that is ten times that of silicon or greater, and thus is expected to be a semiconductor material that can sufficiently reduce ON resistance. These merits of silicon carbide are common to other semiconductors (hereinafter, wide bandgap semiconductor) having a bandgap greater than that of silicon, such as gallium nitride (GaN). Thus, lower resistance and higher voltages of a semiconductor device can be achieved by using a wide bandgap semiconductor.

The efficiency of a power semiconductor device using a wide bandgap semiconductor may be improved by reducing the ON resistance. When a trench-type MOSFET is used for a conventional planar MOSFET, a shorter cell pitch and higher mobility may be obtained, enabling reduction of the ON resistance (for example, refer to Tsunenobu Kimoto and James A. Cooper, "Fundamentals of Silicon Carbide Technology", pp. 320-324, IEEE Press, 2014).

FIG. 18 is a cross-sectional view of a configuration of an active region of a trench-type MOSFET of a related art. The trench-type MOSFET has, for example, an $n^-$-type silicon carbide epitaxial layer 1 on an $n^+$-type silicon carbide substrate 2, plural $p^+$-type bases layer 3 formed in an n-type current spreading layer (hereinafter referred to as CSL layer) region 15 on the $n^-$-type silicon carbide epitaxial layer 1, a p-type channel region 16 and an $n^+$-type source region 17 on the n-type CSL layer region 15, a $p^+$-type region 18 in the p-type channel region 16 and the $n^+$-type source region 17 and in contact with a $p^+$-type base layer 3, a trench 19 formed from a front side toward a $p^+$-type base layer 3, a gate electrode 20 of poly-silicon embedded in the trench 19, a field insulating film region 21 formed on the trench 19, and a source electrode region 22 formed on the front side of the substrate.

SUMMARY OF THE INVENTION

According to one aspect of the invention, a semiconductor device has an active region in which current flows. The semiconductor device includes in the active region: a deposition layer of a first conductivity type formed on a surface of a high-concentration semiconductor substrate of the first conductivity type, the deposition layer having a low concentration; a channel region of a second conductivity type constituting a channel region; a trench formed so as to be in contact with the channel region and in which an oxide film and a gate electrode are embedded; a base layer of the second conductivity type arranged beneath the trench; a third semiconductor layer region of the first conductivity type, in contact with the channel region; a second semiconductor layer region of the first conductivity type and having a maximum impurity concentration higher than that of the third semiconductor layer region, the maximum impurity concentration being farther on a substrate front side than a top of the base layer arranged beneath the trench is; and a first semiconductor layer region of the first conductivity type, in contact with the second semiconductor layer region and having a maximum impurity concentration lower than that of the second semiconductor layer region.

In the semiconductor device, the third semiconductor layer region has a thickness from 0.1 μm to 2.0 μm and an impurity concentration from $5.0 \times 10^{15}$ $cm^{-3}$ to $1.0 \times 10^{17}$ $cm^{-3}$.

In the semiconductor device, the third semiconductor layer region has a thickness A (μm) satisfying $A > 10^8 \times x^{-0.5}$, where, x represents an impurity concentration ($cm^{-3}$).

The semiconductor device includes a source region of the first conductivity type, formed on a surface of the channel region, where a distance from a surface of the source region to the third semiconductor layer region is 0.05 μm to 1.0 μm.

According to another aspect of the invention, a semiconductor device has an active region in which current flows. The semiconductor device includes in the active region: a deposition layer of a first conductivity type formed on a surface of a high-concentration semiconductor substrate of the first conductivity type, the deposition layer having a low concentration; a channel region of a second conductivity type constituting a channel region; a trench formed so as to be in contact with the channel region and in which an oxide film and a gate electrode are embedded; a base layer of the second conductivity type arranged beneath the trench; and a second semiconductor layer region of the first conductivity type and having an impurity gradient in which an impurity concentration represented by a donor concentration minus an acceptor concentration gradually increases from near the channel region toward the base layer.

The semiconductor device includes a first semiconductor layer region of the first conductivity type, in contact with the deposition layer and the base layer, and having an impurity concentration that is higher than that of the deposition layer and lower than that of the second semiconductor layer region.

In the semiconductor device, a source region of the first conductivity type, formed on a surface of the channel region, where a distance from a surface of the source region to the second semiconductor layer region is 0.05 μm to 1.0 μm.

In the semiconductor device, the base layer arranged beneath the trench is additionally arranged beneath a semiconductor layer of the second conductivity type.

According to another aspect of the invention, a method of manufacturing a semiconductor device having an active region in which current flows, includes: forming a deposition layer of a first conductivity type having a low concentration, the deposition layer being formed in the active region on a surface of a high-concentration semiconductor substrate of the first conductivity type; forming a semiconductor layer region of the first conductivity type on a surface of the deposition layer; selectively forming a base layer of a second conductivity type in the semiconductor layer region; forming on a surface of the semiconductor layer region, a channel region of the second conductivity type constituting a channel region; and forming a trench to be in contact with the channel region and embedded with an oxide film and a gate electrode in contact with the base layer from the semiconductor layer region. In forming the semiconductor layer region: a third semiconductor layer region of the first conductivity type in contact with the channel region; a second semiconductor layer region of the first conductivity type having a maximum impurity concentration higher than that of the third semiconductor layer region, the maximum impurity concentration being farther on a substrate front side than a top of the base layer arranged beneath the trench is; and a first semiconductor layer region of the first conductivity type, in contact with the second semiconductor layer region and having a maximum impurity concentration lower than that of the second semiconductor layer region, are each formed as the semiconductor layer region.

According to another aspect of the invention, a method of manufacturing a semiconductor device having an active region in which current flows, includes: forming a deposition layer of a first conductivity type having a low concentration, the deposition layer being formed in the active region on a surface of a high-concentration semiconductor substrate of the first conductivity type; forming a semiconductor layer region of the first conductivity type on a surface of the deposition layer; selectively forming a base layer of a second conductivity type in the semiconductor layer region; forming on a surface of the semiconductor layer region, a channel region of the second conductivity type constituting a channel region; and forming a trench to be in contact with the channel region and embedded with an oxide film and a gate electrode in contact with the base layer from the semiconductor layer region. A second semiconductor layer region of the first conductivity type and having an impurity gradient in which an impurity concentration represented by a donor concentration minus an acceptor concentration gradually increases from near the channel region toward the base layer is formed as the semiconductor layer region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 14 is a cross-sectional view of the active region of the silicon carbide semiconductor device according to the second embodiment during manufacture;

FIGS. 15 and 16 are cross-sectional views of the active region of the silicon carbide semiconductor device according to a third embodiment;

DETAILED DESCRIPTION OF THE INVENTION

Figure 1:
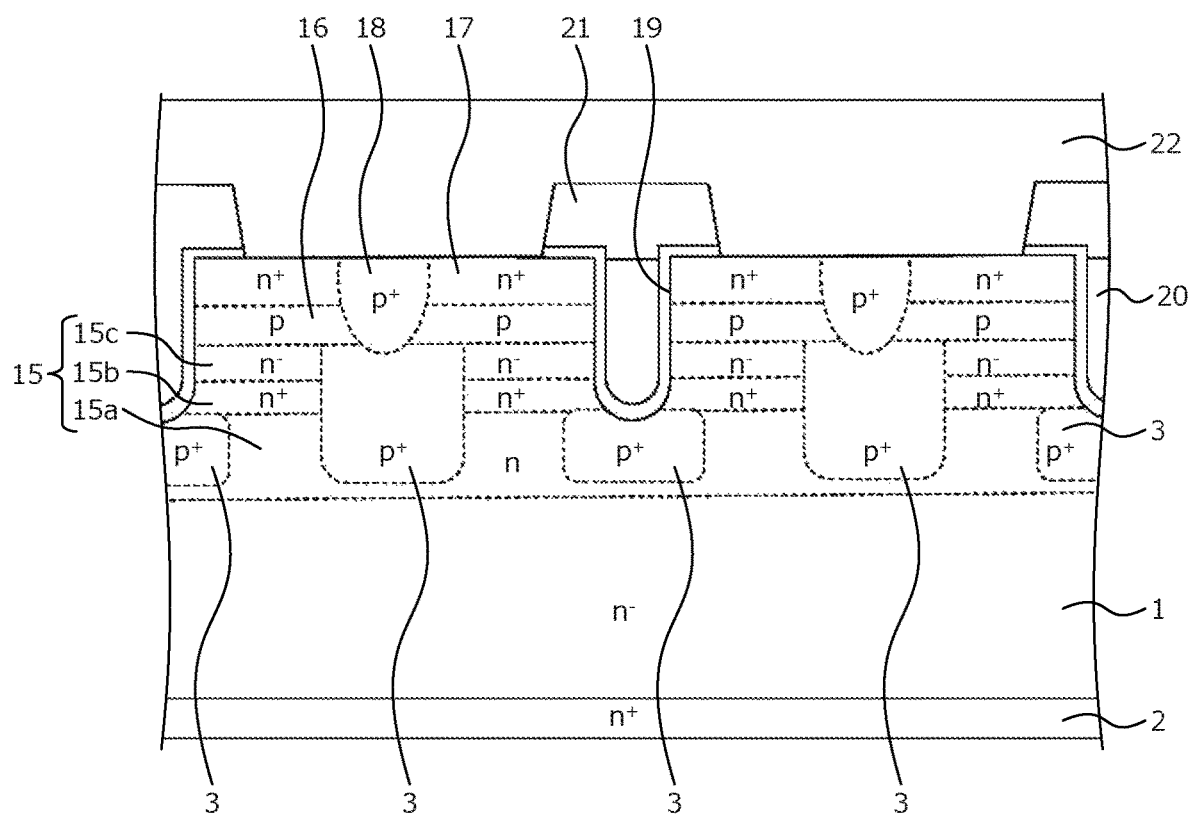
FIG. 1 is a cross-sectional view of an active region of a trench-type MOSFET according to a first embodiment of the present invention.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. When the notations of n and/or p including + or − are the same, this indicates that the concentrations are close, but does not necessarily mean that the concentrations are equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

The semiconductor device according to the present invention uses a wide bandgap semiconductor. In the embodiments, a MOSFET will be described as an example of a silicon carbide semiconductor device produced using, for example, silicon carbide (SiC) as a wide bandgap semiconductor. An example will be described in which a first conductivity type is assumed as an n-type and a second conductivity type is assumed as a p-type.

FIG. 1 is a cross-sectional view of the active region of a trench-type MOSFET according to a first embodiment of the present invention. On a first main surface, for example (0001)-face (Si-face), of the n+-type silicon carbide substrate (wide bandgap semiconductor substrate) 2, a first semiconductor layer of the first conductivity type (n−-type silicon carbide epitaxial layer, wide bandgap semiconductor deposition layer) 1 is deposited.

The n+-type silicon carbide substrate 2 is, for example, a single-crystal silicon carbide substrate doped with nitrogen (N). The n−-type silicon carbide epitaxial layer 1 is a low-concentration n-type drift layer doped with, for example, nitrogen and having an impurity concentration lower than that of the n+-type silicon carbide substrate 2. Hereinafter, the n+-type silicon carbide substrate 2 alone, or the n+-type silicon carbide substrate 2 together with the n−-type silicon carbide epitaxial layer 1 is regarded as a silicon carbide semiconductor substrate.

In the example, the MOSFET depicted in FIG. 1 includes the plural p+-type base layers (base layers of the second conductivity type) 3 of the second conductivity type selectively formed in the n-type CSL layer region (first semiconductor layer) 15 on the n−-type silicon carbide epitaxial layer 1, the p-type channel region (channel region of the second conductivity type) 16 and the n+-type source region 17 formed on the n-type CSL layer region 15, the p+-type region (second semiconductor layer) 18 in a portion of the p-type channel region 16 and the n+-type source region 17 and in contact with the p+-type base layer 3, the trench 19 formed from the front side toward the p+-type base layer 3, the gate electrode 20 of poly-silicon embedded in the trench 19, an interlayer insulating film 21 formed on the trench 19, and the source electrode region 22 formed on the front side of the substrate. Aside from a lower portion of the trench 19, the p+-type base layer 3 is arranged at a lower portion of the p+-type region 18.

By lower the impurity concentration of the n-type CSL layer region 15, in general, a threshold value decrease originating from a short channel effect called drain induced-barrier lowering (DIBL) may be suppressed in the ON state. However, when the impurity concentration of the n-type CSL layer region 15 is lowered, a depletion layer spreads easily from the p-type channel region 16 and the ON resistance suddenly increases.

In the embodiment, to prevent a sudden increase of the ON resistance, the impurity concentration of a third n-type CSL layer region 15c near the p-type channel region 16 effective in suppressing DIBL is lowered with respect to the impurity concentration of a first n-type CSL layer region 15a, and the impurity concentration of a second n-type CSL layer region 15b positioned beneath the third n-type CSL layer region 15c and in contact with the trench 19 is raised with respect to the impurity concentration of the first n-type CSL layer region 15a or is set to be equal thereto.

The n-type CSL layer region 15 includes sequentially from a bottom layer in the drawing of the silicon carbide semiconductor substrate, the first n-type CSL layer region (n-type) 15a, the second n-type CSL layer region (n+-type) 15b, and the third n-type CSL layer region (n−-type) 15c.

Figure 2:
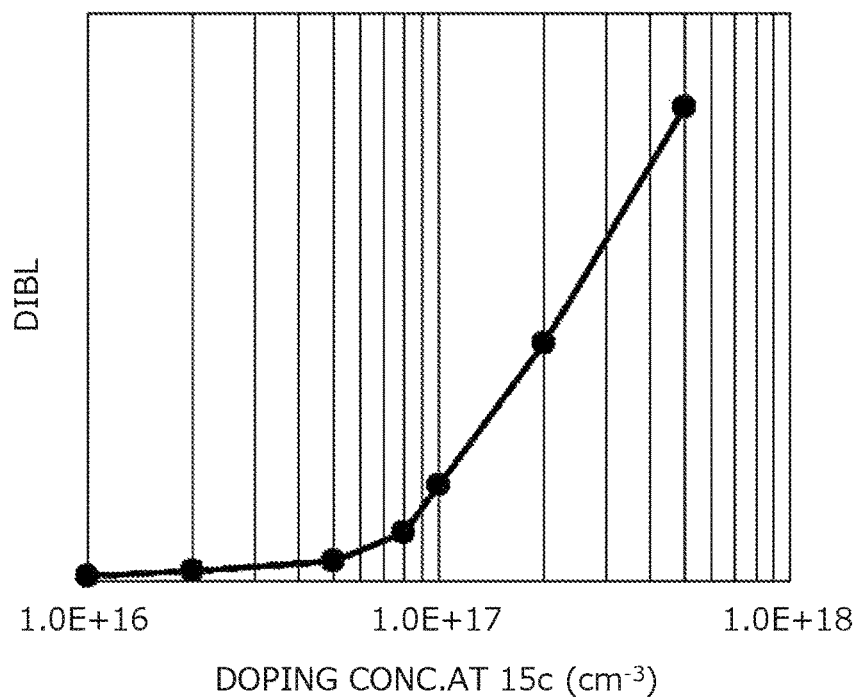
FIG. 2 is a graph of the relationship of impurity concentration of a third n-type CSL layer region and DIBL.

FIG. 2 is a graph of the relationship of the impurity concentration of the third n-type CSL layer region 15c and DIBL. The horizontal axis represents the impurity concentration and the vertical axis represents DIBL. From the graph, it is found that when the impurity concentration of the third n-type CSL layer region (n−-type) 15c is $1.0 \times 10^{17}$ cm$^{-3}$ or less, the effect of suppressing DIBL is significant.

Figure 3:
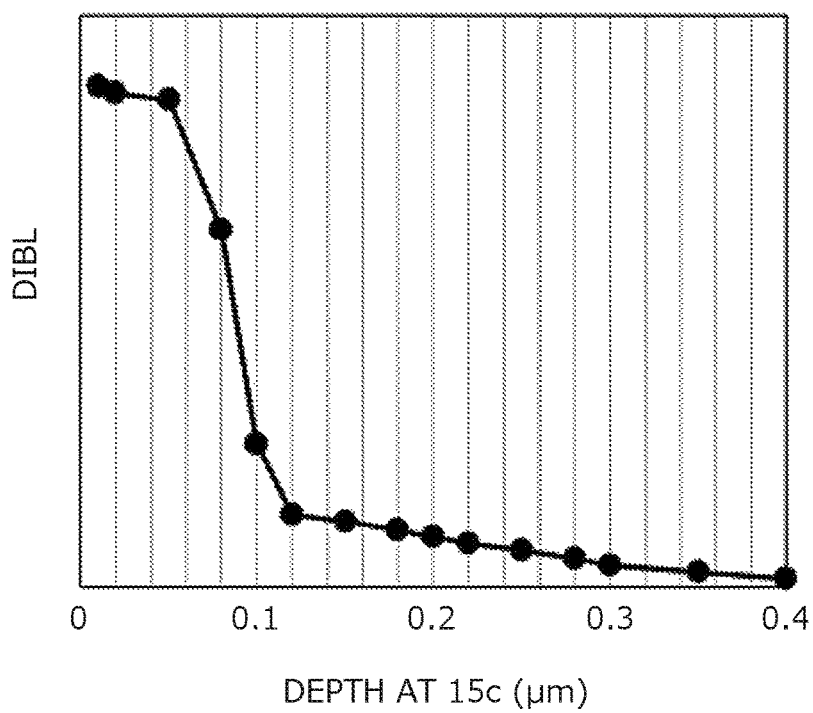
FIG. 3 is a graph of the relationship of the thickness of the third n-type CSL layer region and DIBL.

FIG. 3 is a graph of the relationship of the thickness of the third n-type CSL layer region 15c and DIBL. The graph depicts the relationship of DIBL and the thickness of the third n-type CSL layer region 15c when the impurity concentration of the third n-type CSL layer region 15c is $5.0 \times 10^{16}$ cm$^{-3}$ and the impurity concentration of the second n-type CSL layer region (n+) 15b is $3.0 \times 10^{17}$ cm$^{-3}$. It is found that when the thickness of the third n-type CSL layer region 15c is 0.1 μm or greater, the effect of suppressing DIBL is significant.

The relationship of the ON resistance and the impurity concentration and thickness of the second n-type CSL layer region 15b is closely related to the depletion length from the p+-type base layer 3 and the p-type channel region 16. The depletion length is expressed by equation 1.

$$W_n = \sqrt{\frac{2 \times \varepsilon_{SiC} \times \varepsilon_0}{q \times N_D}} \times (Vbi - V) \tag{1}$$

Figure 4:
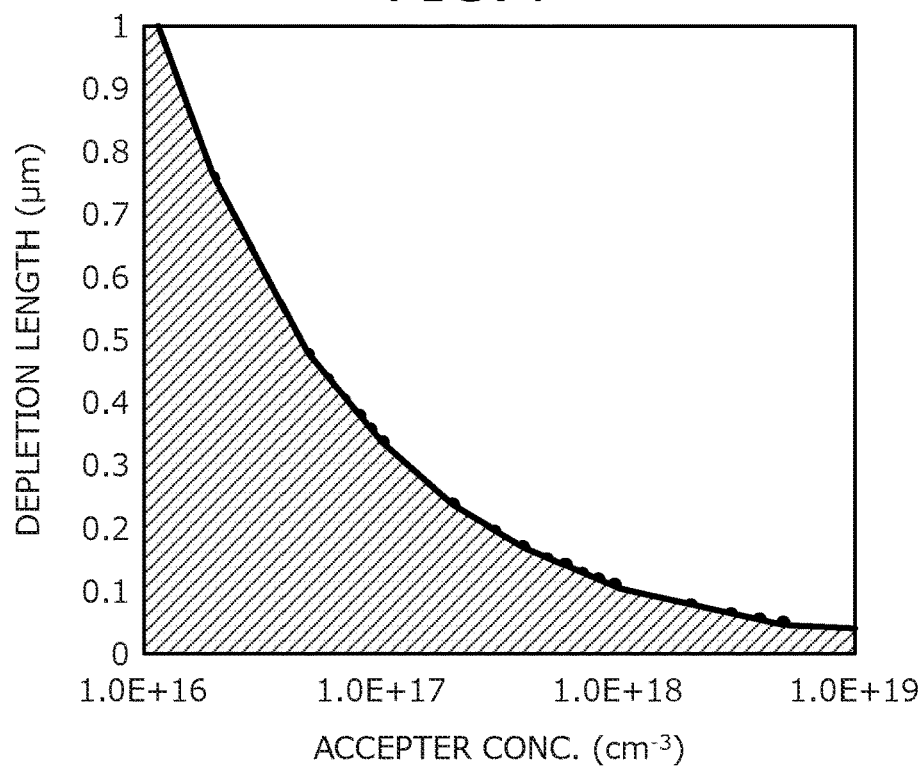
FIG. 4 is a graph of the relationship of impurity concentration of an n-type CSL layer region and the length of a depletion layer spreading in the n-type CSL layer region.

$W_n$=depletion length
$\varepsilon_{SiC}$=dielectric constant of SiC $\varepsilon_0$=new/old dielectric constantq
$\varepsilon_0$=new/old dielectric constantq=elementary charge
q=elementary charge=elementary charge
$N_D$=donor concentration (impurity concentration of n-type layer)
Vbi=built-in voltage of PN junction
V=reverse voltage applied to n-type layer and p-type layer FIG. 4 is a graph of the relationship of the impurity concentration of the n-type CSL layer region and the length of the depletion layer spreading in the n-type CSL layer region. The horizontal axis represents the impurity concentration and the vertical access represents the depletion length. A hatched area in FIG. 4 is a region in which the current path is not inhibited by the depletion layer and the second n-type CSL layer region 15b has to be set to have a thickness and impurity concentration equivalent to the hatched area.

Figure 5:
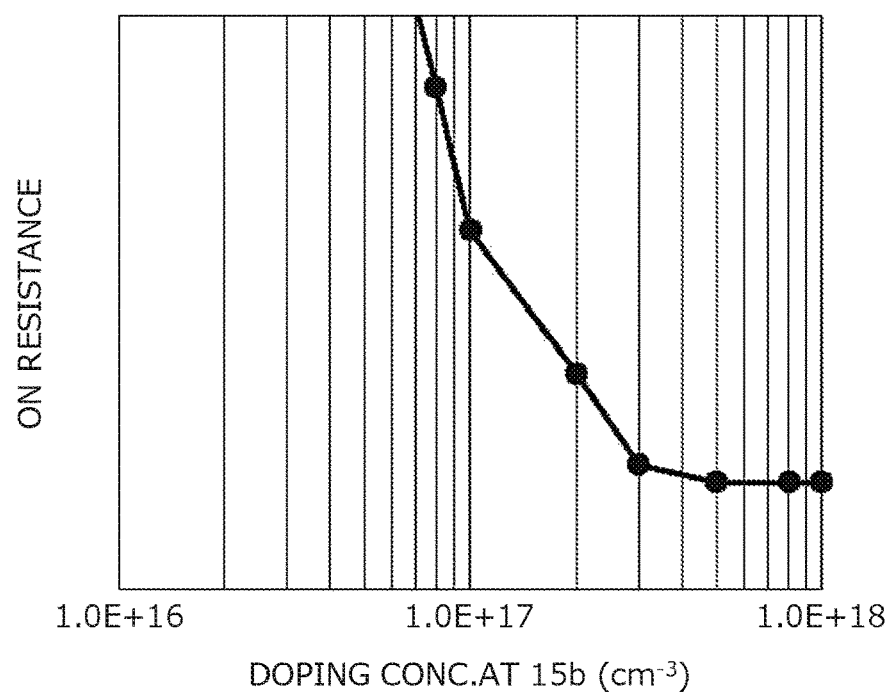
FIG. 5 is a graph of the relationship of ON resistance and impurity concentration of a second n-type CSL layer region.

FIG. 5 is a graph of the relationship of the ON resistance and the impurity concentration of the second n-type CSL layer region 15b. The horizontal axis represents the impurity concentration and the vertical axis represents the ON resistance. FIG. 5 depicts the relationship of the ON resistance and the impurity concentration when the thickness of the second n-type CSL layer region 15b is 0.2 μm. According to FIG. 5, when the thickness of the second n-type CSL layer region 15b is 0.2 μm, the impurity concentration has to be made $3.0 \times 10^{17}$ cm$^{-3}$ or higher. This is reflected in FIG. 5 and it is found that when the concentration is $3.0 \times 10^{17}$ cm$^{-3}$ or less, the ON resistance increases suddenly. Thus, a thickness A of the third n-type CSL layer region 15c is set to satisfy equation 2 with respect to an impurity concentration x.

$$A > 10^8 \times x^{-0.5}$$

Manufacturing processes of the trench-type MOSFET of the first embodiment described will be described sequentially. FIGS. 6, 7, 8, 9, 10, and 11 are cross-sectional views of the active region of the silicon carbide semiconductor device during manufacture according to the first embodiment.

Figure 6:
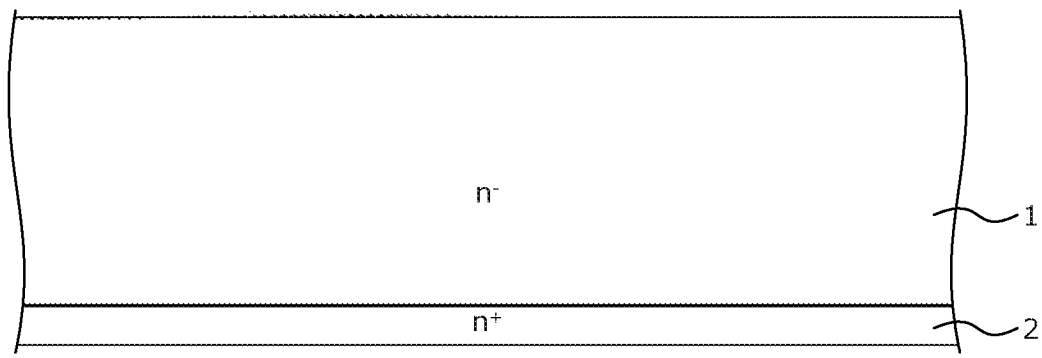
FIGS. 6, 7, 8, 9, 10, and 11 are cross-sectional views of the active region of a silicon carbide semiconductor device during manufacture according to the first embodiment.

First, as depicted in FIG. 6, a single-crystal silicon carbide substrate doped with, for example, nitrogen (N) is prepared as the n+-type silicon carbide substrate 2. The n−-type silicon carbide epitaxial layer 1 is deposited on the n⁺-type silicon carbide substrate 2. The n⁻-type silicon carbide epitaxial layer 1 is a low-concentration n-type drift layer doped with, for example, nitrogen and having an impurity concentration that is lower than that of the n⁺-type silicon carbide substrate 2.

Next, the n-type CSL layer region (dense n-type region) 15 is formed on the first main surface side of the n⁻-type silicon carbide epitaxial layer 1. The n-type CSL layer region 15 is formed having an impurity concentration that is lower than that of the n⁺-type silicon carbide substrate 2 and higher than that of the n⁻-type silicon carbide epitaxial layer 1 and is doped with, for example, nitrogen.

Figure 7:
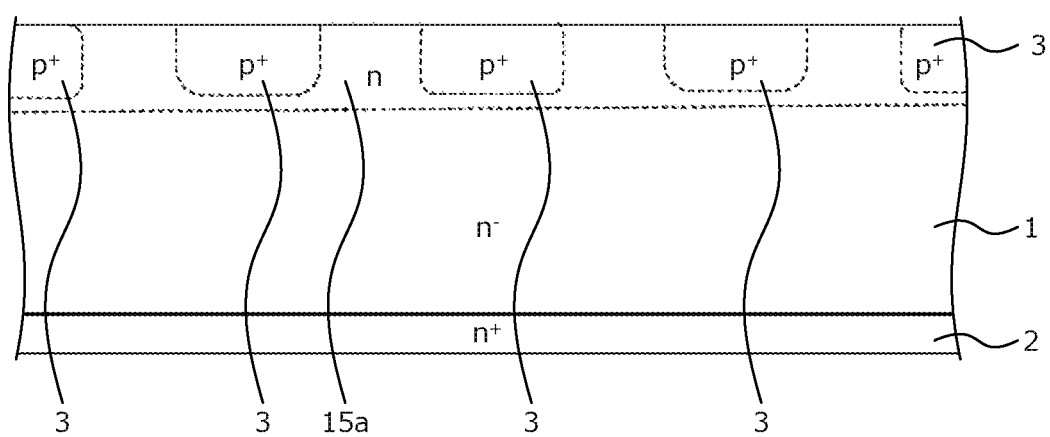

In particular, as depicted in FIG. 7, the silicon carbide substrate surface is patterned by photolithography and implanted with nitrogen to form the first n-type CSL layer region 15a. An impurity concentration of the first n-type CSL layer region 15a may be preferably about $1.0 \times 10^{16}$ to $1.0 \times 10^{19}$ cm⁻³ and the depth thereof may be preferably 0.1 to 2.0 μm. Next, the p⁺-type base layer (first p-type base layer) 3a is selectively formed in the first n-type CSL layer region 15a by patterning and ion implantation of aluminum. An impurity concentration of the p⁺-type base layer 3a may be preferably about $1.0 \times 10^{17}$ to $1.0 \times 10^{19}$ cm⁻³ and the depth thereof may be preferably about 0.1 to 1.5 μm.

Figure 8:
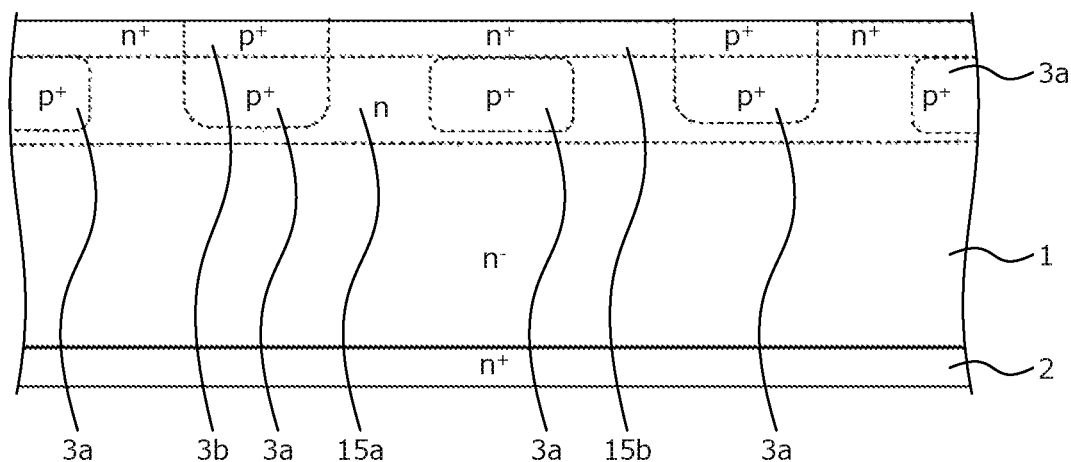

Next, as depicted in FIG. 8, silicon carbide having a concentration equal to that of the n⁻-type silicon carbide epitaxial layer 1 is deposited by nitrogen-added epitaxial growth to have a thickness of 0.1 to 1.5 μm. The second n-type CSL layer region (n⁺-type) 15b is formed by patterning by photolithography and ion implantation of nitrogen on the front side of the first n-type CSL layer region (n-type) 15a. Here, the second n-type CSL layer region (n⁺-type) 15b is formed so that a region having about the same concentration as the n⁻-type silicon carbide epitaxial layer 1 is not possible.

An impurity concentration of the second n-type CSL layer region 15b may be preferably about $1.0 \times 10^{17}$ to $1.0 \times 10^{19}$ cm⁻³ and the depth thereof may be preferably 0.1 to 2.0 μm. Next, the p⁺-type base layer (second p-type base layer) 3b is formed by patterning and ion implantation of aluminum so as to be electrically connected to the p⁺-type base layer 3a. An impurity concentration of the p⁺-type base layer 3b may be preferably about $1.0 \times 10^{17}$ to $1.0 \times 10^{19}$ cm⁻³ and the depth thereof may be preferably 0.2 to 2.0 μm.

Figure 9:
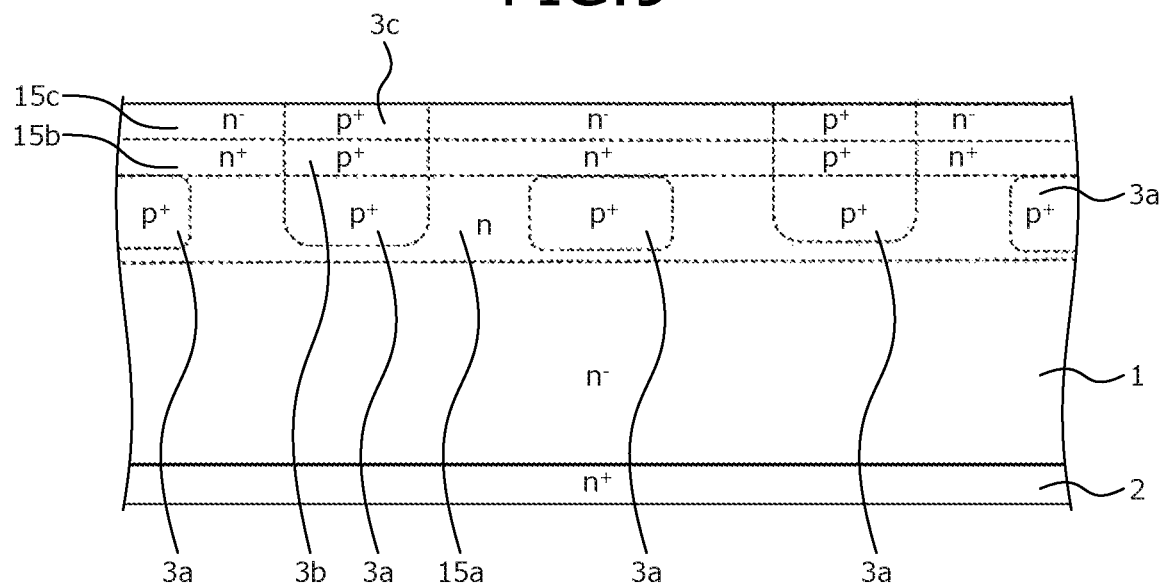

Next, as depicted in FIG. 9, silicon carbide having a concentration equal to that of the n⁻-type silicon carbide epitaxial layer 1 is deposited by nitrogen-added epitaxial growth to have a thickness of 0.1 to 1.5 μm. The third n-type CSL layer region 15c is formed on the front side of the second n-type CSL layer region 15b by patterning by photolithography and ion implantation of nitrogen. Here, the third n-type CSL layer region 15c is formed so that a region having about the same concentration as the n⁻-type silicon carbide epitaxial layer 1 is not possible. Here, an impurity concentration of the third n-type CSL layer region 15c may be preferably $1.0 \times 10^{17}$ to $5.0 \times 10^{15}$ cm⁻³ and the depth thereof may be preferably 0.1 to 2.0 μm. An additional the depth thereof may be preferably 0.2 to 1.5 μm.

Next, a p⁺-type base layer (third p-type base layer) 3c is formed by patterning and ion implantation of aluminum so as to be electrically connected to p⁺-type base layers 3a, 3b. An impurity concentration of the p⁺-type base layer 3c may be preferably about $1.0 \times 10^{17}$ to $1.0 \times 10^{19}$ cm⁻³ and the depth thereof may be preferably about 0.2 to 2.0 μm.

Regions of the second n-type CSL layer region 15b and the third n-type CSL layer region 15c formed by the processes depicted in FIGS. 8 and 9 may be provided to have a concentration gradient along a depth direction by depositing silicon carbide to have a thickness of 0.2 to 3.0 μm and by performing patterning by photolithography and ion implantation of nitrogen after the process (formation of the first n-type CSL layer region 15a and the p⁺-type base layer 3a) depicted in FIG. 7.

Figure 10:
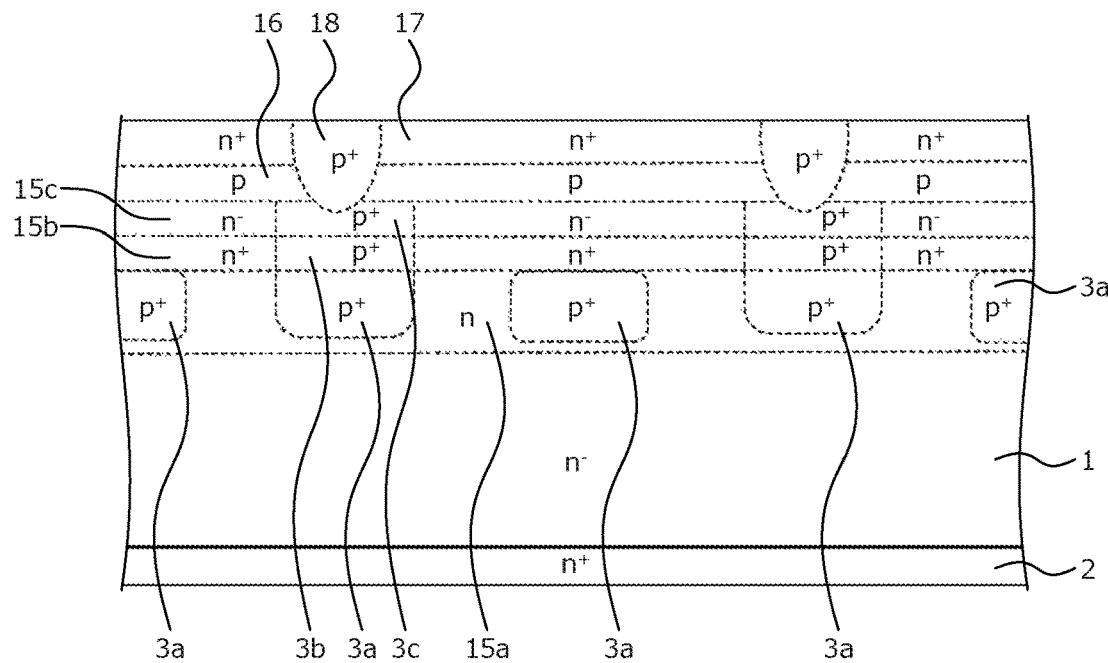

Next, as depicted in FIG. 10, silicon carbide is deposited by nitrogen-added or aluminum-added epitaxial growth to have a thickness of 0.1 to 1.5 μm. The p-type channel region 16 is formed by patterning by photolithography and ion implantation of aluminum. An impurity concentration of the p-type channel region 16 may be preferably about $1.0 \times 10^{16}$ to $1.0 \times 10^{19}$ cm⁻³ and the depth thereof may be preferably about 0.3 to 1.5 μm. The p-type channel region 16 may be formed by aluminum-added epitaxial growth to have a concentration of about $1.0 \times 10^{16}$ to $1.0 \times 10^{19}$ cm⁻³ and the ion implantation of aluminum may be omitted.

Thereafter, the n⁺-type source region 17 is formed by patterning by photolithography and ion implantation of phosphorus, or arsenic, or nitrogen. An impurity concentration of the n⁺-type source region 17 may be preferably about $1.0 \times 10^{18}$ to $1.0 \times 10^{20}$ cm⁻³ and the depth thereof may be preferably about 0.05 to 0.5 μm.

Next, the p⁺-type region 18 is formed by patterning by photolithography and ion implantation of aluminum to be electrically connected to the p⁺-type base layer 3c. An impurity concentration of the p⁺-type region 18 may be preferably about $1.0 \times 10^{17}$ to $1.0 \times 10^{20}$ cm⁻³ and the depth thereof may be preferably about 0.2 to 2.0 μm. After a carbon film is deposited to have a thickness of about 0.01 to 5.0 μm, annealing at a temperature of 1500 to 1900 degrees C. is performed, activating the ion implanted impurities.

Figure 11:
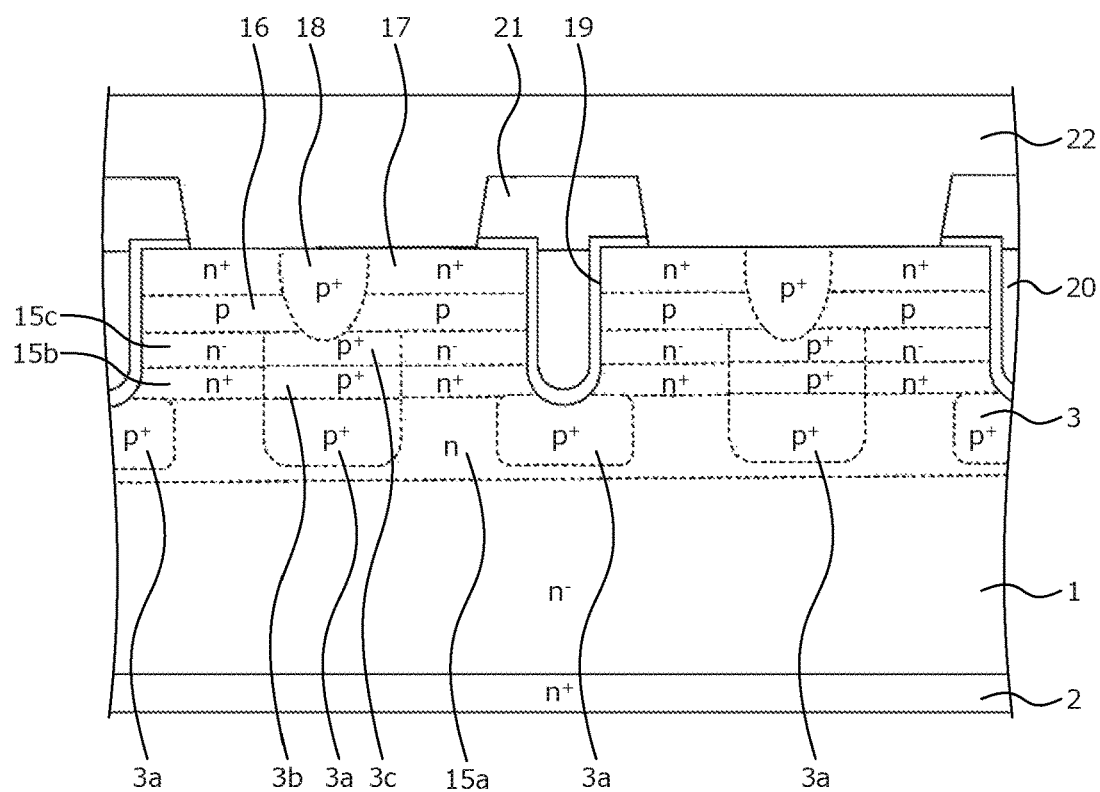

Next, as depicted in FIG. 11, the trench 19 is formed by patterning by photolithography and dry etching so as to not penetrate the p⁺-type base layer 3a. The width of the trench 19 may be preferably 0.1 to 1.5 μm and the depth thereof may be preferably about 0.2 to 2.0 μm. Poly-silicon is deposited so as to cover the inside of the trench 19. Poly-silicon 19, for example, is formed by a high-temperature oxide (HTO) film formed at a high temperature of about 600 to 900 degrees C. by a low-pressure CVD method to have a thickness of 30 nm to 200 nm. After the oxide film (poly-silicon) is deposited so as to be embedded in the trench 19, etching is performed leaving the poly-silicon in at least ⅔ of the depth of the trench 19 thereby forming the gate electrode 20.

After an oxide film is deposited to have a thickness of about 0.1 to 3.0 μm, the interlayer insulating film 21 is formed on the trench 19 by patterning and etching. One or more of titanium, nickel, tungsten, and aluminum are deposited by a deposition method or a sputtering method to have a total thickness of about 0.5 to 8.0 μm and patterning and etching are performed, forming the source electrode 22.

Thereafter, on a rear surface (lower portion in drawing) of the n⁺-type silicon carbide substrate 2, a rear electrode is provided constituting a drain electrode. By the method described, the active region of the trench-type MOSFET in the first embodiment (FIG. 1) is formed.

In FIG. 1, although a structure of only 3 trenches is depicted, more trench MOS structures may be arranged in parallel.

A second embodiment of the semiconductor device according to the present invention will be described. In the second embodiment as well, the silicon carbide semiconductor device produced using, for example, silicon carbide (SiC) as a wide bandgap semiconductor will be described taking a MOSFET as an example.

Figure 12:
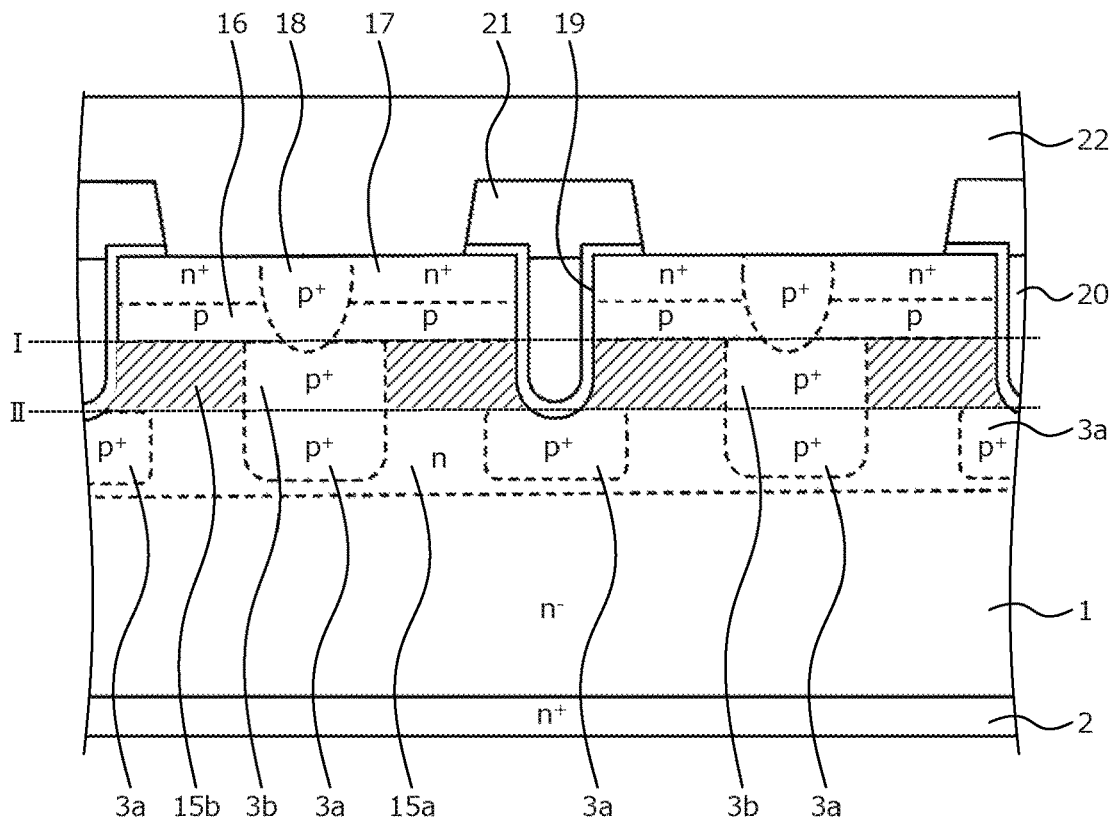
FIG. 12 is a cross-sectional view of the active region of the trench-type MOSFET according to a second embodiment of the present invention.

FIG. 12 is a cross-sectional view of the active region of the trench-type MOSFET according to the second embodiment of the present invention. In the second embodiment, the n-type CSL layer region 15 is constituted by the first n-type CSL layer region 15a and the second n-type CSL layer region 15b.

Figure 13:
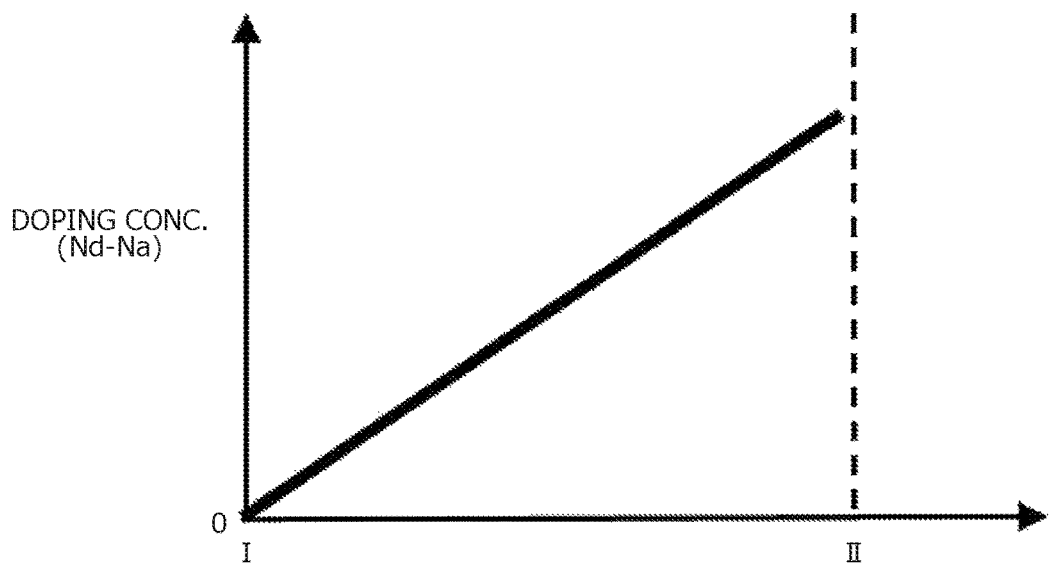
FIG. 13 is a graph of an impurity concentration gradient between lines I and II of the second n-type CSL layer region depicted in FIG. 12.

FIG. 13 is a graph of an impurity concentration gradient between lines I and II of the second n-type CSL layer region depicted in FIG. 12. The horizontal axis represents the distance between lines I and II, a height of the semiconductor substrate (depth direction) and the vertical axis indicates the impurity concentration gradient. The height direction of the second n-type CSL layer region 15b indicated by the hatched area in FIG. 12 has a concentration gradient in which, in the depth direction, the impurity concentration nearest the p-type channel region 16 is lower and the impurity concentration farthest on the first n-type CSL layer region 15a side is higher.

Manufacturing processes of the trench-type MOSFET of the second embodiment will be described sequentially. FIG. 14 is a cross-sectional view of the active region of the silicon carbide semiconductor device according to the second embodiment during manufacture.

Processes of the method of manufacturing according to the second embodiment are similar to those according to the first embodiment up to FIG. 7 (formation of the first n-type CSL layer region 15a and the p+-type base layer 3a). Thereafter, as depicted in FIG. 14, silicon carbide is deposited by nitrogen-added epitaxial growth to have a concentration equal to that of the n−-type silicon carbide epitaxial layer 1 and a thickness of 0.2 to 3.0 µm.

The second n-type CSL layer region 15b is formed by patterning by photolithography and ion implantation of nitrogen to have the concentration gradient depicted in FIG. 13. An impurity concentration of a site of I of the second n-type CSL layer region 15b may be preferably about $1.0 \times 10^{16}$ to $1.0 \times 10^{17}$ cm$^{-3}$ and an impurity concentration of a site of II of the second n-type CSL layer region 15b may be preferably about $1.1 \times 10^{17}$ to $5.0 \times 10^{18}$ cm$^{-3}$.

As depicted in FIG. 13, even when the impurity concentration does not vary with respect to depth and exhibits a linear-shaped plot, the impurity concentration of a site of I is lower with respect to a site of II and the impurity concentrations of sites of I and II suffice to have the values indicated above.

Subsequently, silicon carbide is deposited by nitrogen-added or aluminum-added epitaxial growth to have a thickness of 0.1 to 1.5 µm. Thereafter, the production method is identical to the first embodiment (FIGS. 10 and 11). Thus, the active region of the trench-type MOSFET of the second embodiment may be formed by the described method of manufacturing a semiconductor device.

A third embodiment of the semiconductor device according to the present invention will be described. In the third embodiment as well, the silicon carbide semiconductor device produced using, for example, silicon carbide (SiC) as a wide bandgap semiconductor will be described taking a MOSFET as an example.

A cross-sectional view of the active region of the trench-type MOSFET according to the third embodiment of the present invention is the same as that of the second embodiment (FIG. 12).

In the manufacturing processes of the trench-type MOSFET in the third embodiment, the first n-type CSL layer region 15a and the p+-type base layer 3 are formed by the processes as those depicted in FIGS. 6 and 7 of the first embodiment.

Figure 16:
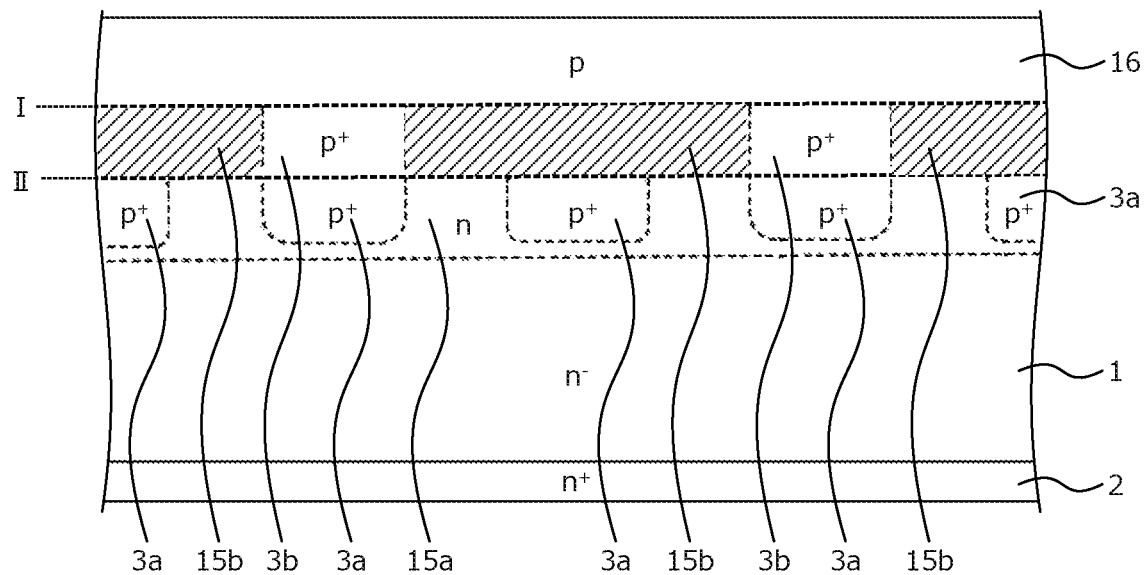

FIGS. 15 and 16 are cross-sectional views of the active region of the silicon carbide semiconductor device according to the third embodiment. As depicted in FIG. 15, on the first n-type CSL layer region 15a, silicon carbide is deposited by nitrogen-added epitaxial growth to have a concentration equal to the n−-type silicon carbide epitaxial layer 1 and a thickness of 0.2 to 3.0 µm. The second n-type CSL layer region 15b is formed by patterning by photolithography and ion implantation of nitrogen. An impurity concentration of the second n-type CSL layer region 15b may be preferably about $1.0 \times 10^{16}$ to $1.0 \times 10^{19}$ cm$^{-3}$ and the depth thereof may be preferably 0.1 to 2.0 µm.

Next, as depicted in FIG. 16, on the second n-type CSL layer region 15b, silicon carbide is deposited by nitrogen-added or aluminum-added epitaxial growth to have a thickness of 0.1 to 1.5 µm. The p-type channel region 16 is formed by patterning by photolithography and ion implantation of aluminum.

Figure 17:
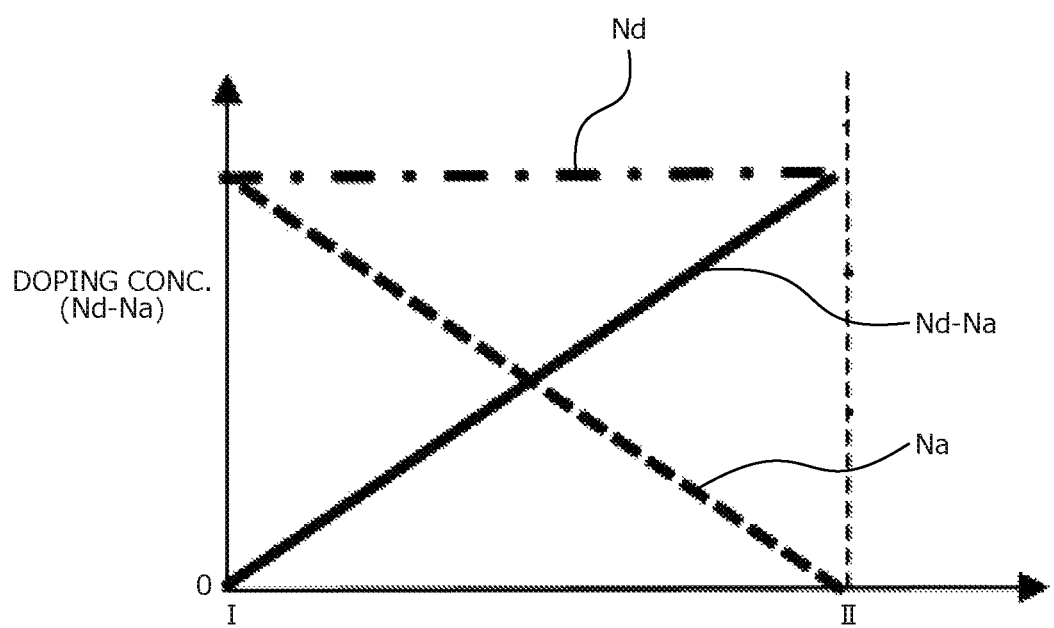
FIG. 17 is a graph of the relationship of donor concentration and acceptor concentration between lines I and II of the second n-type CSL layer region depicted in FIG. 16.
Figure 18:
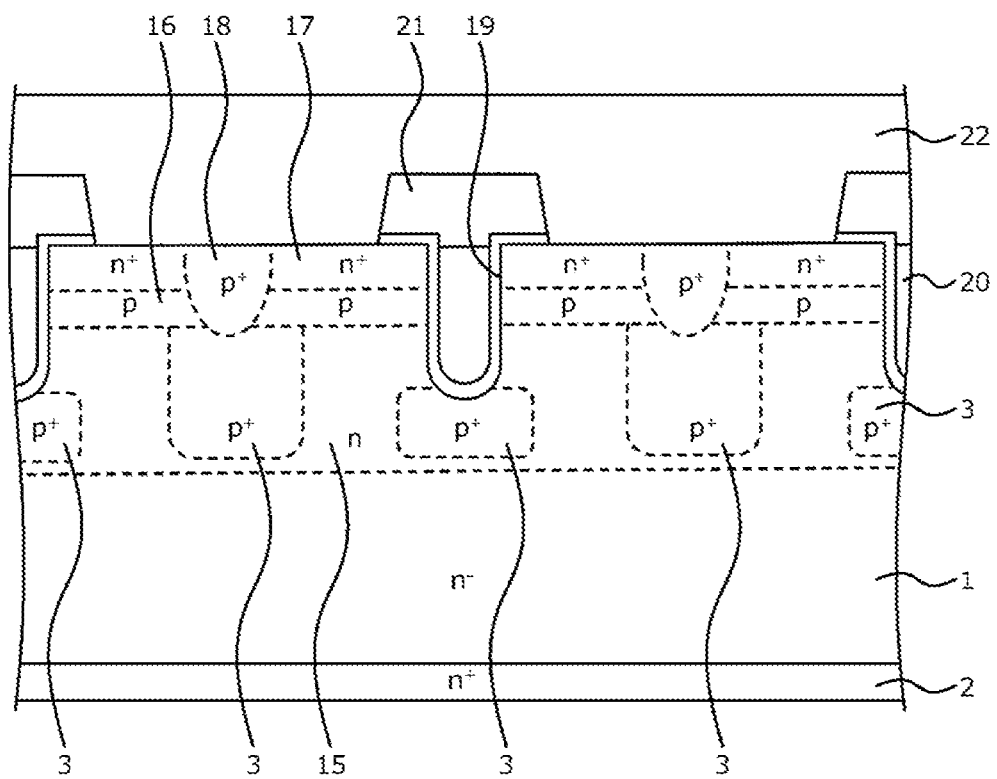
FIG. 18 is a cross-sectional view of a configuration of an active region of a trench-type MOSFET of a related art.

FIG. 17 is a graph of the relationship of donor concentration and acceptor concentration between lines I and II of the second n-type CSL layer region depicted in FIG. 16. The horizontal axis represents the distance between lines I and II, a height of the semiconductor substrate (depth direction) and the vertical axes represent acceptor concentration and donor concentration. In the ion implantation processes above, the second n-type CSL layer region 15b is formed to have an aluminum concentration gradient as depicted in FIG. 17. The impurity concentration represented by Nd—Na of a site of I may be preferably about $1.0 \times 10^{16}$ to $1.0 \times 10^{17}$ and the impurity concentration represented by Nd—Na of a site of II may be preferably about $1.1 \times 10^{17}$ to $5.0 \times 10^{18}$.

Thereafter, the n+-type source region 17 (refer to FIG. 10) is formed by patterning by photolithography and ion implantation of phosphorus, or arsenic, or nitrogen. The impurity concentration of the n+-type source region 17 may be preferably about $1.0 \times 10^{18}$ to $1.0 \times 10^{20}$ cm$^{-3}$ and the depth thereof may be preferably about 0.05 to 0.5 µm. Thereafter, the production method is identical to the first embodiment (FIGS. 10 and 11). Thus, the active region of the trench-type MOSFET of the third embodiment may be formed by the described method of manufacturing a semiconductor device.

In the embodiments above, although an example has been described in which a main surface of a silicon carbide substrate including silicon carbide is assumed to be a (0001)-face and on the (0001)-face, a MOS is configured, the present invention is not limited hereto and various modifications related to, for example, the wide bandgap semiconductor, orientation of the main surface of the substrate, etc. are possible.

However, in a conventional trench-type MOSFET, when the channel length is reduced to lower the ON resistance, short channel effects occur, and a new problem of suppressing short channel effects arises. Short channel effects occur in regions in which the channel length is less than 1.0 µm.

According to the embodiments, a threshold value decrease originating from a short channel effect is suppressed. Conventionally, when the impurity concentration of the n-type CSL layer region 15 is simply lowered, a depletion layer spreads easily from the p-type channel region 16, blocking the current path whereby the ON resistance increases suddenly. In the embodiments, the impurity concentration of the third n-type CSL layer region 15c near the p-type channel region 16 effective in suppressing DIBL is lowered with respect to the n-type CSL layer region 15a and the impurity concentration second n-type CSL layer region 15b positioned beneath the third n-type CSL layer region 15c and in contact with the trench 19 is raised with respect to the impurity concentration of the first n-type CSL layer region 15a or is set to be equal thereto, thereby resolving this problem.

The semiconductor device and the method of manufacturing a semiconductor device according to the present invention enable suppression of short channel effects and reduction of the ON resistance by further reduction of the channel length.

As described, the semiconductor device and the method of manufacturing a semiconductor device of the present invention are useful for high voltage semiconductor devices used in power converting equipment and power supply devices such as those in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device having an active region in which current flows, the semiconductor device comprising in the active region:
   a high-impurity-concentration semiconductor substrate of a first conductivity type;
   a deposition layer of the first conductivity type formed on a surface of the substrate, the deposition layer having an impurity concentration lower than that of the substrate;
   a channel region of a second conductivity type constituting a channel, the channel region having a bottom side that is a closest side to the surface of the substrate in a depth direction;
   a plurality of trenches contacting the channel region;
   an oxide film and a gate electrode, the oxide film and the gate electrode being embedded in each of the plurality of trenches;
   a first base layer of the second conductivity type, disposed beneath each of the plurality of trenches, the first base layer having an upper side that is a furthest side from the surface of the substrate in the depth direction, and a second base layer of the second conductivity type, disposed between two of the plurality of trenches that are adjacent to each other; and
   a semiconductor layer region of the first conductivity type, having an upper surface in contact with the channel region and a lower surface in contact with the deposition layer, the semiconductor layer region having an impurity concentration higher than that of the deposition layer, the semiconductor layer region including
      a third semiconductor layer region in contact with the channel region,
      a second semiconductor layer region in contact with the third semiconductor layer region, the second semiconductor layer region having a gradient of an impurity concentration that continuously decreases from near the third semiconductor layer region toward the deposition layer in the depth direction, the second semiconductor layer region having a bottom side that is a closest side to the surface of the substrate in the depth direction, and
      a first semiconductor layer region in contact with the second semiconductor layer region, the second base layer being disposed in the first to third semiconductor layer regions, wherein
   a first distance between the bottom side of the second semiconductor layer region and the bottom side of the channel region in the depth direction is not greater than a second distance between the upper side of the first base layer and the bottom side of the channel region.

2. The semiconductor device according to claim 1, wherein the third semiconductor layer region has a thickness A in the range of 0.1 μm to 2.0 μm and an impurity concentration in the range of $5.0 \times 10^{15}$ cm$^{-3}$ to $1.0 \times 10^{17}$ cm$^{-3}$.

3. The semiconductor device according to claim 2, wherein the third semiconductor layer region has the thickness A (μm) satisfying $A > 10^8 \times x^{-0.5}$, where, x represents the impurity concentration (cm$^{-3}$).

4. The semiconductor device according to claim 1, further comprising
   a source region of the first conductivity type, formed on a surface of the channel region, wherein
   a distance from a surface of the source region to the third semiconductor layer region in the depth direction is in the range of 0.05 μm to 1.0 μm.

5. A semiconductor device having an active region in which current flows, the semiconductor device comprising in the active region:
   a high-impurity-concentration semiconductor substrate of a first conductivity type;
   a deposition layer of the first conductivity type formed on a surface of the substrate, the deposition layer having an impurity concentration lower than that of the substrate;
   a channel region of a second conductivity type constituting a channel, the channel region having a bottom side that is a closest side to the surface of the substrate in a depth direction;
   a plurality of trenches contacting the channel region;
   an oxide film and a gate electrode embedded in each of the plurality of trenches;
   a first base layer of the second conductivity type, beneath each of the plurality of trenches, the first base layer having an upper side that is a furthest side from the surface of the substrate in the depth direction, and a second base layer of the second conductive type between two of the plurality of trenches that are adjacent to each other; and
   a semiconductor layer region of the first conductivity type including
      one semiconductor layer region, having a gradient of an impurity concentration that continuously increases from near the channel region toward the first base layer in the depth direction, the impurity concentration being equal to a concentration that is obtained from a donor concentration minus an acceptor concentration, the second base layer being disposed in the one semiconductor layer, the one semiconductor layer region having a bottom side that is a closest side to the surface of the substrate in the depth direction, wherein
   a third distance between the bottom side of the one semiconductor layer region and the bottom side of the channel region in the depth direction is not greater than a fourth distance between the upper side of the first base layer and the bottom side of the channel region.

6. The semiconductor device according to claim 5, wherein the semiconductor layer region further includes an other semiconductor layer region of the first conductivity type, in contact with the deposition layer and the first base layer, and having an impurity concentration higher than that of the deposition layer and lower than that of the one semiconductor layer region.

7. The semiconductor device according to claim 5, further comprising
  a source region of the first conductivity type, formed on a surface of the channel region, wherein
  a distance from a surface of the source region to the one semiconductor layer region in the depth direction is in the range of 0.05 µm to 1.0 µm.

* * * * *